United States Patent
Kikuchi et al.

(10) Patent No.: US 9,803,924 B2
(45) Date of Patent: Oct. 31, 2017

(54) VERTICAL HEAT TREATMENT APPARATUS

(71) Applicant: Tokyo Electron Limited, Tokyo (JP)

(72) Inventors: Hiroshi Kikuchi, Iwate (JP); Tsutomu Wakamori, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/633,367

(22) Filed: Feb. 27, 2015

(65) Prior Publication Data

US 2015/0253082 A1 Sep. 10, 2015

(30) Foreign Application Priority Data

Mar. 4, 2014 (JP) ................................ 2014-041607

(51) Int. Cl.

| H01L 21/22 | (2006.01) |
|---|---|
| H01L 21/31 | (2006.01) |
| F27B 17/00 | (2006.01) |
| F27D 3/00 | (2006.01) |
| H01L 21/677 | (2006.01) |

(52) U.S. Cl.
CPC ........ F27B 17/0025 (2013.01); F27D 3/0084 (2013.01); H01L 21/67757 (2013.01); F27D 2003/0065 (2013.01); F27D 2003/0086 (2013.01)

(58) Field of Classification Search
CPC .... H01L 21/67772; H01L 21/22; H01L 21/31
USPC ................................. 432/241, 242, 237, 250
See application file for complete search history.

(56) References Cited

U.S. PATENT DOCUMENTS

| 4,943,235 A * | 7/1990 | Nakao ..................... C30B 31/00 432/205 |
|---|---|---|
| 5,632,820 A * | 5/1997 | Taniyama ........... C23C 16/4401 118/715 |
| 6,499,933 B2 * | 12/2002 | Tanigawa .......... H01L 21/67706 187/362 |
| 2005/0175952 A1 * | 8/2005 | Toba ................. H01L 21/67109 432/241 |
| 2008/0199818 A1 * | 8/2008 | Nitadori .............. F27B 17/0025 432/6 |
| 2014/0120487 A1 * | 5/2014 | Kaneko ............... F27B 17/0025 432/250 |
| 2014/0305540 A1 * | 10/2014 | Oyama ............. H01L 21/67389 141/4 |

(Continued)

FOREIGN PATENT DOCUMENTS

| JP | 04-147616 A | 5/1992 |
|---|---|---|
| JP | 10-092320 A | 4/1998 |

(Continued)

*Primary Examiner* — Gregory A Wilson
(74) *Attorney, Agent, or Firm* — Abelman, Frayne & Schwab

(57) ABSTRACT

Disclosed is a vertical heat treatment apparatus. The apparatus includes: a heat treatment furnace provided with a furnace inlet at a lower end thereof; a cover unit disposed on the furnace inlet of the heat treatment furnace; a cover unit opening/closing mechanism configured to support the cover unit in a cantilever manner from a bottom side of the cover unit; and an auxiliary mechanism configured to press the cover unit from the bottom side of the cover unit when the cover unit is disposed on the furnace inlet. The auxiliary mechanism is provided with a toggle mechanism.

3 Claims, 5 Drawing Sheets

(A)

(B)

(56) References Cited

U.S. PATENT DOCUMENTS

2015/0168070 A1* 6/2015 Trent, Jr. .............. F27D 1/1858
432/1

FOREIGN PATENT DOCUMENTS

| JP | 2003-282548 A | | 10/2003 |
|---|---|---|---|
| JP | 2007073746 A | * | 3/2007 |
| JP | 2011-176262 A | | 9/2011 |

* cited by examiner

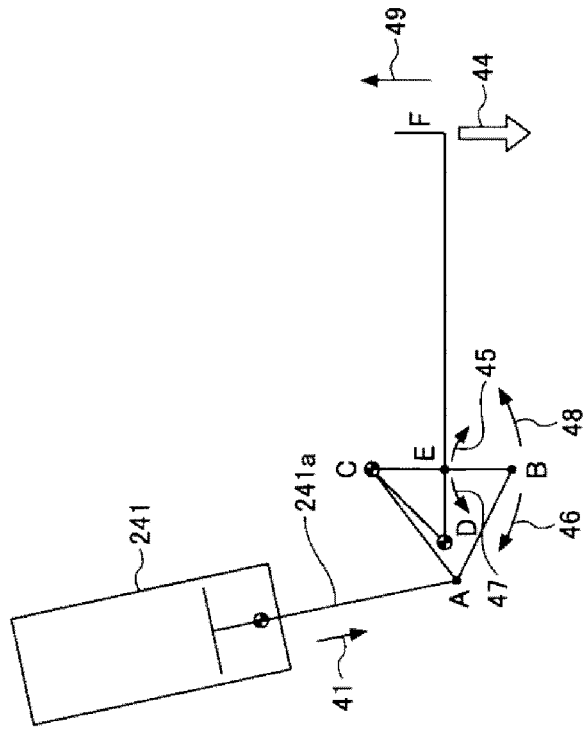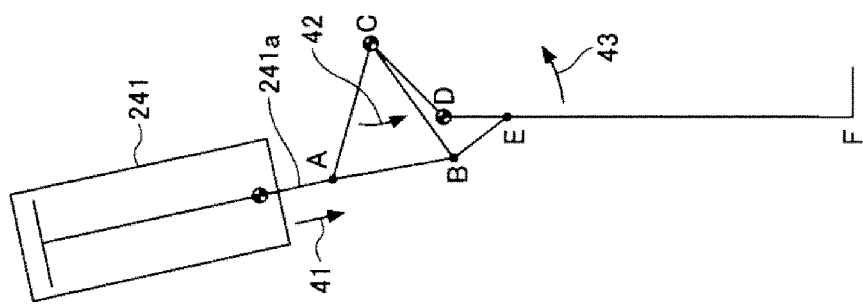

VERTICAL HEAT TREATMENT APPARATUS

CROSS-REFERENCE TO RELATED APPLICATIONS

This application is based on and claims priority from Japanese Patent Application No. 2014-041607, filed on Mar. 4, 2014, with the Japan Patent Office, the disclosure of which is incorporated herein in its entirety by reference.

TECHNICAL FIELD

The present disclosure relates to a vertical heat treatment apparatus.

BACKGROUND

In fabricating a semiconductor device, various processing apparatuses (semiconductor apparatuses) are used to perform processings such as, for example, oxidation, diffusion, chemical vapor deposition (CVD), and annealing on a processing target object, for example, a substrate such as, for example, a semiconductor wafer (hereinafter, simply referred to as a "wafer"). In addition, as one of the processing apparatuses, a batch processing type heat treatment apparatus has been known in which a heat treatment may be performed on a plurality of wafers at one type.

In the batch processing type heat treatment apparatus, wafers are conveyed from the outside of the apparatus by a carrying container (also referred to as a "carrier" or a "FOUP") configured to accommodate a plurality of wafers and the carrying container is supplied into the vertical heat treatment apparatus through, for example, a load port serving as a carry-in/out part of the apparatus. In addition, the wafers are taken out from the supplied carrying container and transferred to a boat (holder) configured to hold a plurality of wafers to be spaced apart from each other in a height direction. Subsequently, the boat is introduced into a heat treatment furnace having a furnace port in the lower end thereof from a lower side of the heat treatment furnace so that the wafers are provided to various processings.

In the vertical heat treatment apparatus, the furnace inlet of the heat treatment furnace is blocked by a cover provided below the boat while the boat is introduced into the heat treatment furnace. However, since the cover moves down together with the boat after the boat is taken out from the heat treatment furnace, the furnace inlet of the heat treatment furnace is in a released state.

When the furnace inlet is released, heat within the furnace is discharged to the outside of the heat treatment furnace, and thus, the temperature within furnace may decrease. Thus, when a heat treatment is performed on wafers of the next batch, a time is required for increasing the temperature, and as a result, the productivity may deteriorate. Further, the heat discharged from the inside of the furnace may have an adverse effect on components around the furnace inlet.

Therefore, for example, Japanese Patent Laid-Open Publication No. 04-147616 discloses a vertical heat treatment apparatus which is provided with a heat treatment furnace provided substantially vertically and including an opening for loading/unloading a processing target object in the lower end of the heat treatment furnace and an opening/closing mechanism configured to close the opening of the heat treatment furnace while no treatment is performed. In the vertical heat treatment apparatus disclosed in Japanese Patent Laid-Open Publication No. 04-147616, it is also disclosed that the opening/closing mechanism is constituted by, for example, a disc-shaped cover unit which is in contact with the circular opening of the heat treatment furnace, a drive mechanism unit for driving the cover unit, and an arm unit for connecting the cover unit and the drive mechanism unit.

SUMMARY

An aspect of the present disclosure provides a vertical heat treatment apparatus. The vertical heat treatment apparatus comprising: a heat treatment furnace provided with a furnace inlet at a lower end thereof; a cover unit disposed on the furnace inlet of the heat treatment furnace; a cover unit opening/closing mechanism configured to support the cover unit in a cantilever manner from a bottom side of the cover unit; and an auxiliary mechanism configured to press the cover unit from the bottom side of the cover unit when the cover unit is disposed on the furnace inlet. The auxiliary mechanism is provided with a toggle mechanism.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 4A and 4B are explanatory views illustrating a toggle mechanism of an auxiliary mechanism in the vertical processing apparatus according to the exemplary embodiment of the present disclosure.

DETAILED DESCRIPTION

Figure 1:
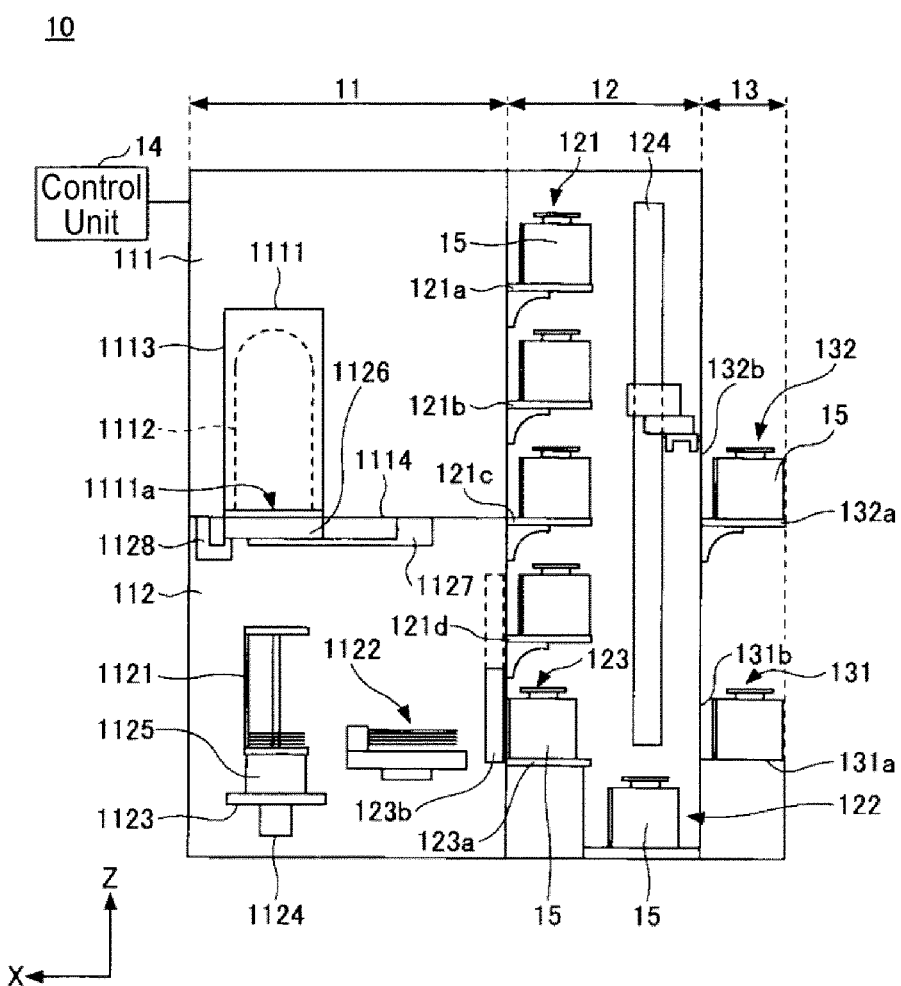
FIG. 1 is a schematic explanatory view illustrating a vertical processing apparatus according to an exemplary embodiment of the present disclosure.

In the following detailed description, reference is made to the accompanying drawing, which form a part hereof. The illustrative exemplary embodiments described in the detailed description, drawing, and claims are not meant to be limiting. Other exemplary embodiments may be utilized, and other changes may be made without departing from the spirit or scope of the subject matter presented here.

In the vertical heat treatment apparatus disclosed in Japanese Patent Laid-Open Publication No. 04-147616, the cover unit is supported in a cantilever manner only by the arm unit. As a result, it is difficult for the arm unit to support the cover unit horizontally and when the cover unit is in contact with the opening of the heat treatment furnace to block the furnace inlet of the heat treatment furnace, a gap may occur between the peripheral edge of the opening and the cover unit, and as a result, the opening may not be sealed.

In consideration of the problems in the related art, the present disclosure is to provide a vertical heat treatment apparatus which is excellent in sealability when a furnace inlet of a heat treatment furnace is blocked by a cover unit.

In order to solve the problems in the related art, the present disclosure provides a vertical heat treatment apparatus comprising: a heat treatment furnace provided with a furnace inlet at a lower end thereof; a cover unit disposed on the furnace inlet of the heat treatment furnace; a cover unit opening/closing mechanism configured to support the cover unit in a cantilever manner from a bottom side of the cover unit; and an auxiliary mechanism configured to press the cover unit from the bottom side of the cover unit when the cover unit is disposed on the furnace inlet. The auxiliary mechanism is provided with a toggle mechanism.

In the vertical heat treatment apparatus described above, the cover unit may include a furnace inlet shielding unit configured to block the furnace inlet, and a support member configured to support the furnace inlet shielding unit through a plurality of elastic bodies. The cover unit opening/closing mechanism may support the cover unit in a cantilever manner from a bottom side of the support member, and the auxiliary mechanism may press the cover unit from the bottom side of the support member.

In the vertical heat treatment apparatus described above, the auxiliary mechanism may press an area inside of a region surrounded by contact points of the support member and the plurality of elastic bodies when the auxiliary mechanism presses the support member from the bottom side of the support member.

According to the present disclosure, it may be possible to provide a vertical heat treatment apparatus which is excellent in sealability when a furnace inlet of a heat treatment furnace is blocked by a cover unit.

Hereinafter, an exemplary embodiment for carrying out the present disclosure will be described with reference to the accompanying drawings. However, the present disclosure is not limited to the exemplary embodiment described below and various modifications and substitutions may be made without departing from the scope of the present disclosure.

In the present exemplary embodiment, descriptions will be made on an exemplary configuration of a vertical heat treatment apparatus.

The vertical heat treatment apparatus of the present exemplary embodiment may include a heat treatment furnace provided with a furnace inlet at a lower end thereof, a cover unit placed in the furnace inlet of the heat treatment furnace, a cover unit opening/closing mechanism configured to support the cover unit in a cantilever manner from the bottom side of the cover unit, and an auxiliary mechanism configured to press the cover unit from the bottom side of the cover unit when the cover unit is disposed on the furnace inlet. In addition, the auxiliary mechanism may include a toggle mechanism.

Hereinafter, a configuration of the vertical heat treatment apparatus of the exemplary embodiment will be described in detail with reference to FIG. 1 which illustrates a schematic cross-sectional view of the vertical heat treatment apparatus of the present exemplary embodiment.

As illustrated in FIG. 1, the vertical heat treatment apparatus 10 of the present exemplary embodiment may include a heat treatment unit 11. An exemplary configuration of the heat treatment unit 11 will be described below.

(Heat Treatment Unit)

The heat treatment unit 11 may include a heat treatment furnace area 1111 and a loading area 112. A heat treatment furnace 1111 may be disposed in the heat treatment furnace area 111. In the loading area 112, wafers may be transferred between a carrying container 15 and a holder 1121 in order to supply the wafers to the heat treatment furnace 1111 or carry out the wafers, on which a treatment has been performed in the heat treatment furnace 1111.

Further, the carrying container 15 may be used to convey and store wafers as a processing target object. The carrying container 15 may accommodate a plurality of (e.g., 25) wafers therein. When the carrying container 15 is, for example, a seal type front opening unified pod (FOUP), a take-out opening for loading/unloading the processing target object may be formed at one end and a detachable/attachable cover may be disposed on the take-out opening. In addition, the carrying container 15 is substantially hermetically sealed by the cover. In general, the internal atmosphere of the carrying container 15 is formed of clean air. In addition, for example, two lock mechanisms are provided on the cover, and the cover may be attached to or detached from the take-out opening by locking or unlocking the lock mechanisms.

The heat treatment furnace area 111 may be disposed in the loading area 112 as illustrated in FIG. 1. The heat treatment furnace 1111 may include a reaction tube 1112 which is a vertically elongated processing container having a lower end opened as a furnace inlet 1111a, and a heater 1113 disposed to cover the periphery of the reaction tube 1112. The configuration of the heater 1113 is not particularly limited, but may heat the inside of the reaction tube 1112 to, for example, 300° C. to 1200° C.

The reaction tube 1112 may be made of, for example, quartz and may be connected with a plurality of gas introduction pipes that introduces a processing gas or an inert gas for purge into the reaction tube 1112 or an exhaust pipe including, for example, a vacuum pump or a pressure control valve which may control the inside of the reaction tube 1112. Further, the furnace inlet 1111a may be formed in the bottom of the reaction tube 1112 to introduce the wafers therethrough. A cross-sectional shape of the furnace opening 1111a on a horizontal plane (a plane vertical to the Z axis in the drawing) may be optionally selected according to, for example, the shape of wafers as a processing target object. As a result, the cross-sectional shape is not particularly limited, but may be, for example, a circular shape.

The reaction tube 1112 or the heater 1113 may be disposed on a base plate 1114 and an opening is formed through the base plate 1114 to carry in/out the holder 1121 that holds wafers from a lower side in the drawing. The base plate 1114 may be made of, for example, stainless steel.

In the loading area 112, for example, the holder 1121 may be disposed so as to transfer the wafers in the carrying container 15 placed on a placing table 123a of a transfer section 123 of a carrying and storing unit 12 (described below).

In detail, for example, as illustrated in FIG. 1, a transfer mechanism 1122 may be disposed to transfer the wafers between the carrying container 15 placed on the loading table 123a of the transfer section 123 and the holder 1121. Further, the transfer mechanism 1122 may transfer the wafers to the holder 1121 from the carrying container 15 in order to supply the wafers to the heat treatment furnace 1111. However, the transfer mechanism 1122 may also transfer wafers, on which the heat treatment has been completed, to the carrying container 15 from the holder 1121 after the heat treatment.

The holder 1121 is also referred to as a boat and may hold a plurality of wafers like a shelf. The holder 1121 is placed on a cover 1123 through a heat insulating unit (a heat insulating tube) 1125.

The cover 1123 is supported on a lift mechanism (not illustrated) and may be moved up by the lift mechanism to seal the furnace inlet 1111a of the heat treatment furnace 1111. The holder 1121 placed on the cover 1123 may be carried into or out of the heat treatment furnace 1111 by the lift mechanism.

In addition, a rotation mechanism 1124 may be provided so as to rotate the holder 1121 placed on the cover 1123 and rotate the wafers in a horizontal plane in the heat treatment furnace 1111.

Moreover, in the loading area 112, a cover unit 1126 may be provided to be placed on the furnace inlet 1111a of the heat treatment furnace 1111 when the holder 1121 or the cover 1123 moves down. A cover unit opening/closing mechanism 1127 may be provided in the cover unit 1126 to support the cover unit 1126 in a cantilever manner from the bottom side of the cover unit 1126. In addition, an auxiliary mechanism 1128 may also be provided to press the cover unit 1126 from the bottom side of the cover unit 1126 when the cover unit 1126 is placed in the furnace inlet. The auxiliary mechanism 1128 may include a toggle mechanism.

A structure around the furnace inlet 1111a of the heat treatment furnace 1111 will be described with reference to FIGS. 2A and 2B, FIG. 3 and FIGS. 4A and 4B.

Figure 2A:
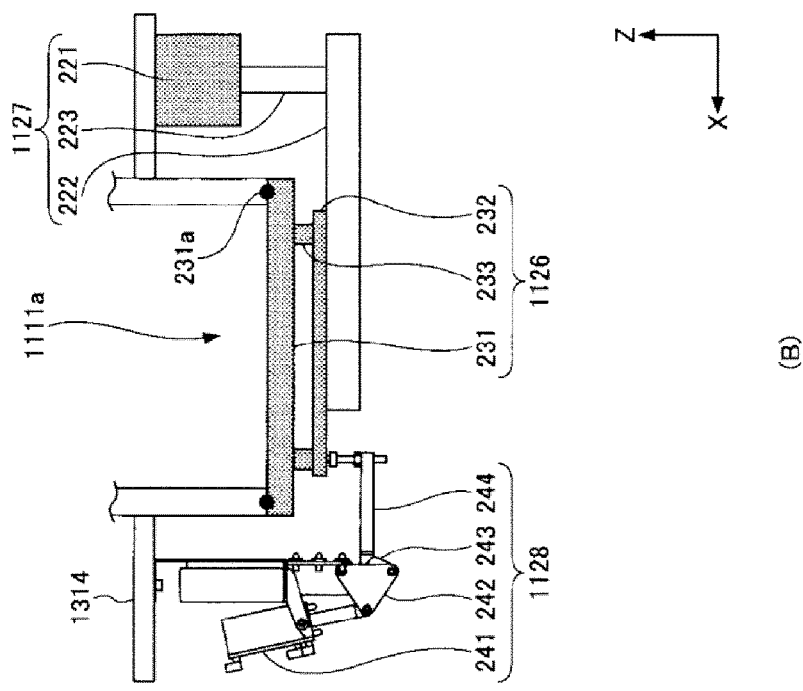
FIGS. 2A and 2B are explanatory views illustrating a periphery of a furnace inlet of a heat treatment furnace in the vertical processing apparatus according to the exemplary embodiment of the present disclosure.
Figure 2B:
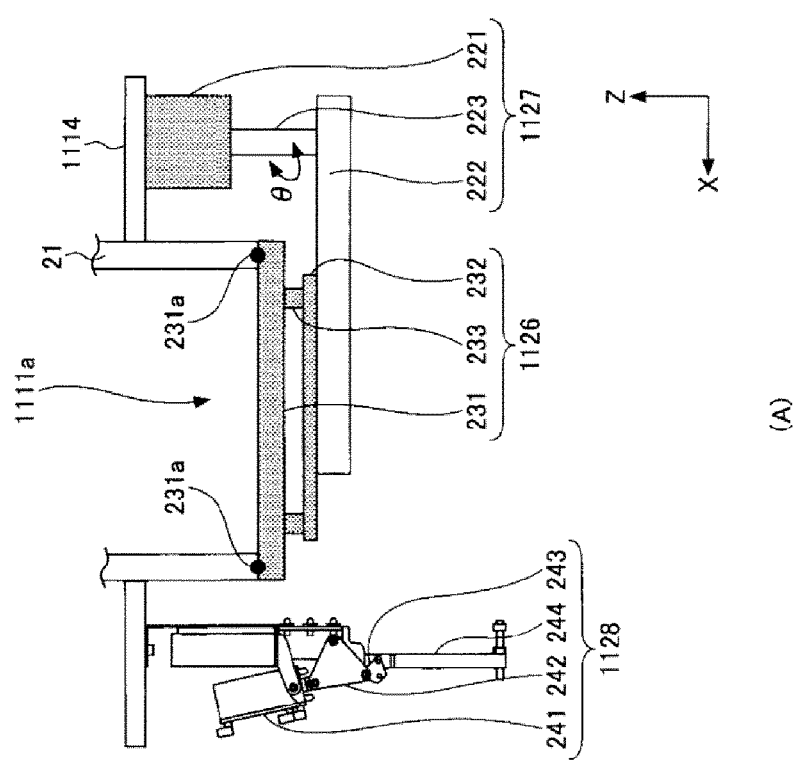

FIGS. 2A and 2B correspond to cross-sectional views illustrating the periphery of the furnace inlet 1111a of the heat treatment furnace 1111 in the vertical heat treatment apparatus 10 of the exemplary embodiment, in an enlarged scale.

In FIGS. 2A and 2B, the holder 1121 or the cover 1123 moves down, then, the cover unit 1126 is disposed to cover the furnace inlet 1111a formed by a manifold 21 in order to block the furnace inlet 1111a of the heat treatment furnace 1111, and the cover unit 1126 comes into contact the manifold 21. In addition, FIG. 2A illustrates a state in which the cover unit 1126 is not pressed by the auxiliary mechanism 1128 and FIG. 2B illustrates a state in which the cover unit 1126 is pressed by the auxiliary mechanism 1128 from the bottom side of the cover unit 1126.

Herein, the cover unit 1126, the cover unit opening/closing mechanism 1127, and the auxiliary mechanism 1128 illustrated in FIGS. 2A and 2B will be described.

The cover unit 1126 may be configured to block the furnace inlet 1111a. Although not particularly limited in a detailed configuration, the cover unit 1126 may include, for example, a furnace inlet shielding unit 231 configured to block the furnace inlet 1111a and a support member 232 configured to support the furnace inlet shielding unit 231 through a plurality of elastic bodies 233. In addition, the cover unit opening/closing mechanism 1127 may be configured to support the cover unit 1126 in a cantilever manner from the bottom side of the support member 232. Further, the auxiliary mechanism 1128 may press the cover unit 1126 from the bottom side of the support member 232.

When the cover unit 1126 includes the furnace inlet shielding unit 231 and the support member 232 configured to support the furnace inlet shielding unit 231 through the plurality of elastic bodies 233, a force applied to a local or narrow range of the support member 232 by the cover unit opening/closing mechanism 1127 or the auxiliary mechanism 1128 is distributed by the elastic bodies 233 and transferred to the furnace inlet shielding unit 231. As a result, the force may be substantially uniformly applied to the surface of the furnace inlet shielding unit 231 which faces the support member 232 and occurrence of a gap between the manifold 21 and the furnace inlet shielding unit 231 forming the furnace inlet 1111a may be prevented. Further, as illustrated in FIGS. 2A and 2B, when a seal member 231a is provided on a portion of the furnace inlet shielding unit 231 which faces the manifold 21, the seal member 231a is substantially uniformly compressed so that the sealability of the furnace inlet 1111a by the furnace inlet shielding unit 231 may be increased.

Although the shape of the furnace inlet shielding unit 231 is not particularly limited as long as the furnace inlet shielding unit 231 may be configured to block the furnace inlet 1111a, the surface of the furnace inlet shielding unit 231 which faces the furnace inlet 1111a may have a shape similar to the furnace inlet 1111a, that is, for example, a circular shape. In this case, the furnace inlet shielding unit 231 may be larger than the furnace inlet 1111a to be in contact with the surface of the manifold 21 which forms the furnace inlet 1111a and faces the furnace inlet shielding unit 231. In addition, the external appearance of the furnace inlet shielding unit 231 may have, for example, a plate shape. When the furnace inlet 1111a has the circular shape as described above, the furnace inlet shielding unit 231 may have a disc shape.

Further, as described above, the seal member 231a may be disposed on the surface of the furnace inlet shielding unit 231 which faces the furnace inlet 1111a, at a location where the furnace inlet shielding unit 231 is in contact with the manifold 21. The seal member 231a is not particularly limited, but for example, an O-ring may be used as the seal member. In addition, for example, various supplementary facilities including a cooling mechanism for cooling the furnace inlet shielding unit 231 or the seal member 231a may be optionally disposed in the furnace inlet shielding unit 231.

Although the configuration of the elastic bodies 233 are not particularly limited as long as the elastic bodies 233 connect the furnace inlet shielding unit 231 and the support member 232 with each other so as to support the furnace inlet shielding unit 231, for example, springs may be used as the elastic bodies. In particular, since the elastic bodies 233 are disposed in the vicinity of the furnace inlet 1111a, it is more preferable that the elastic bodies 233 have high heat resistance and metallic springs are used as the elastic bodies 233. Although the number of elastic bodies 233 disposed between the furnace inlet shielding unit 231 and the support member 232 is not particularly limited, for example, three or more elastic bodies may be disposed so as to more uniformly distribute the force applied from the support member 232. The elastic bodies 233 may be disposed at any positions without being particularly limited. However, it is preferable that the elastic bodies 233 are disposed so as to more uniformly transfer the force applied to the local range or the narrow range on the support member 232 by the cover unit opening/closing mechanism 1127 or the auxiliary mechanism 1128 to the furnace inlet shielding unit 231 in the plane of the furnace inlet shielding unit 231. For example, when the furnace inlet shielding unit 231 has the disc shape, the elastic body 233 may be disposed such that contact points of the furnace inlet shielding unit 231 and the plurality of elastic bodies 233 are positioned on one circle. In particular, the elastic body 233 may be disposed such that a circle passing through the contact points of the furnace inlet shielding unit 231 and the plurality of elastic bodies 233 forms a concentric circle with the circle of the peripheral edge of the furnace inlet shielding unit 231.

The support member 232 is not particularly limited and the support member 232 is in connect with the plurality of elastic bodies 233 on the top surface, i.e. the surface facing the furnace inlet shielding unit 231. Further, the support member 232 may be connected with the cover unit opening/closing mechanism 1127 at the bottom side thereof. The shape of the support member 232 is not particularly limited, but may be, for example, a disc shape.

Further, a positional relationship between the furnace inlet shielding unit 231 and the support member 232 when the furnace inlet shielding unit 231 is disposed on the support member 232 through the elastic bodies 233 is not particularly limited. For example, the furnace inlet shielding unit 231 and the support member 232 may be disposed such that a straight line passing through the center of the support member 232 and the center of furnace inlet shielding unit 231 is vertical to the surface of the furnace inlet shielding unit 231 which faces the furnace inlet 1111a.

Next, the cover unit opening/closing mechanism 1127 will be described.

The cover unit opening/closing mechanism 1127 supports the cover unit 1126 from the bottom side of the cover unit 1126 as described above. In addition, the cover unit opening/closing mechanism 1127 may convey the cover unit 1126 to a predetermined location. For example, while the holder 1121 is introduced into the heat treatment furnace 1111 by moving up the holder 1121 or the cover 1123, the cover unit opening/closing mechanism 1127 may convey the cover unit 1126 to a retreat location and dispose the cover unit 1126 at the retreat location so that the cover unit 1126 does not interfere with the holder 1121 or the cover 1123 subsidiary thereto.

Further, while the holder 1121 or the cover 1123 moves down, the cover unit opening/closing mechanism 1127 may convey the cover unit 1126 to a furnace inlet shielding location and dispose the cover unit 1126 so that the cover unit 1126 blocks the furnace inlet 1111a. Further, the furnace inlet shielding location may include both a full-close furnace inlet shielding location and a half-close inlet shielding location which are different in the Z-axis direction in the drawing as described below.

The cover unit opening/closing mechanism 1127 is not particularly limited as long as the cover unit opening/closing mechanism 1127 may convey the cover unit 1126 between the retreat location and the furnace inlet shielding location at a predetermined timing as described above.

For example, as illustrated in FIGS. 2A and 2B, the cover unit opening/closing mechanism 1127 may include a cylinder unit 221, an arm unit 222 configured to support the cover unit 1126, and a shaft unit 223 configured to connect the cylinder unit 221 and the arm unit 222. In addition, the cover unit opening/closing mechanism 1127 may rotate (pivot) the arm unit 222 in a θ direction indicated by a bi-directional arrow in FIG. 2A by the cylinder unit 221 around the shaft unit 223 as a rotation axis. Further, the cover unit opening/closing mechanism 1127 may move the arm unit 222 in the Z-axis direction by the cylinder unit 221.

Figure 3:
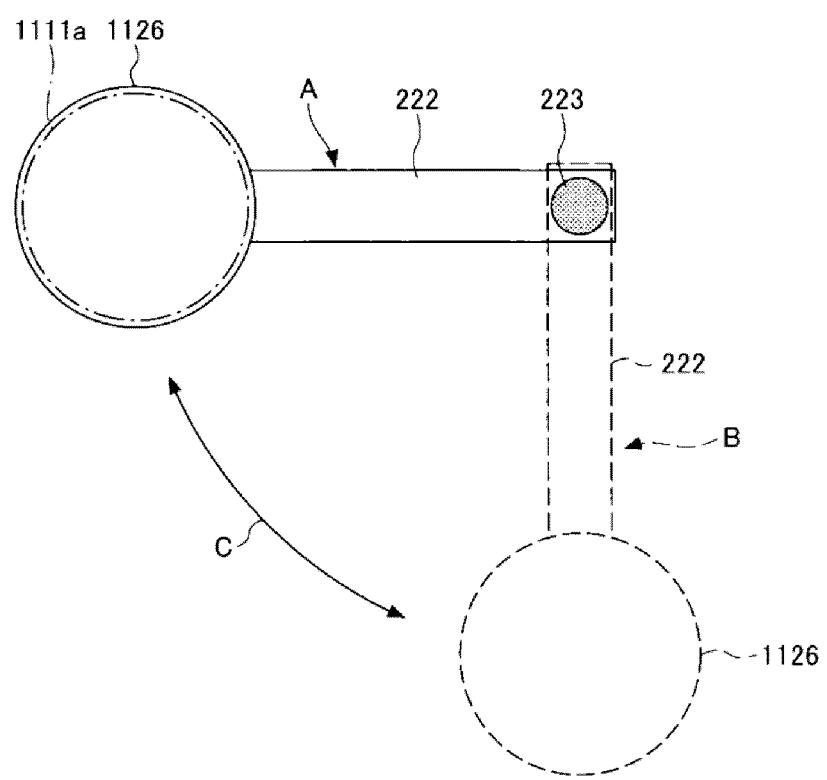
FIG. 3 is an explanatory view illustrating an operation when a cover unit is conveyed by a cover unit opening/closing mechanism in the vertical processing apparatus according to the exemplary embodiment of the present disclosure.

Descriptions will be made on the movement and conveyance between the furnace inlet shielding location and the retreat location of the cover unit 1126 when the cover unit opening/closing mechanism 1127 includes the cylinder unit 221, the arm unit 222, and the shaft unit 223 as described above, with reference to FIGS. 2A, 2B, and 3. FIG. 3 is a view illustrating the cover unit 1126 and the cover unit opening/closing mechanism 1127 viewed from the furnace inlet 1111a. Members other than those required for description are omitted.

In FIG. 3, the furnace inlet 1111a is indicated by a one-dot chain line and when the arm unit 222 and the cover unit 1126 supported by the arm unit 222 are positioned at location A indicated by solid lines, the furnace inlet 1111a is blocked by the cover unit 1126 and the cover unit 1126 is positioned at the furnace inlet shielding location. Further, the furnace inlet shielding location refers to a location of the cover unit 1126 where the cover unit 1126 may block the furnace inlet 1111a as described above. When the cover unit 1126 is positioned at the furnace inlet shielding location, the cover unit 1126 may be positioned just below the furnace inlet 1111a and the seal member 231a provided on the furnace inlet shielding unit 231 of the cover unit 1126 may be positioned just below the manifold 21 forming the furnace inlet 1111a. In particular, when the cover unit 1126 is positioned at the furnace inlet shielding location, the cover unit 1126 may be positioned at a place where the center of the furnace inlet 1111a and the center of the surface of the cover unit 1126 facing the furnace inlet 1111a coincide with each other.

When the cover unit 1126 is disposed at location A of FIG. 3, the cover unit 1126 may be moved up in the Z-axis direction and conveyed to the location (the full-close furnace inlet shielding location) to be in contact with the manifold 21 so as to close the furnace inlet 1111a as illustrated in FIGS. 2A and 2B (full close). Further, in order to maintain the temperature and the atmosphere in the heat treatment furnace 1111 by interrupting the heat from the heat treatment furnace 1111, the furnace inlet 1111a may be in the full-close state as described. However, when the heat from the heat treatment furnace 1111 may be just interrupted to a certain degree, the cover unit 1126 may be disposed at a location (half close furnace inlet shielding location) spaced apart from the furnace inlet 1111a so as to cover the furnace inlet 1111a without causing the cover unit 1126 to be in contact with the manifold 21 (half close).

In addition, when the holder 1121 is introduced into the heat treatment furnace 1111, the arm unit 222 and the cover unit 1126 may be moved to location B indicated by dotted lines by rotating the arm unit 222 along arrow C by the cylinder unit 221, using the shaft unit 223 as the rotation axis. When the arm unit 222 and the cover unit 1126 are positioned at location B, the furnace inlet 1111a is exposed to the loading area 112 so that the holder 1121 may be introduced into the furnace inlet 1111a and the cover unit 1126 is positioned at the retreat location.

In FIG. 3, an angle between the arm unit 222 at location A and the arm unit 222 at location B is approximately 90°, but is not limited thereto. The retreat location refers to a location of the cover unit 1126 where the cover unit 1126 does not interfere with the holder 1121 or the cover 1123 subsidiary thereto when the holder 1121 is introduced into the heat treatment furnace 1111 as described above. As a result, the retreat location varies depending on the arrangement or size of each member in the vertical heat treatment apparatus 10 and an angle between the arm unit 222 when the cover unit 1126 is positioned at the furnace inlet shielding location and the arm unit 222 when the cover unit 1126 is positioned at the retreat location may be optionally selected.

Up to now, descriptions have been made on an exemplary configuration of the cover unit opening/closing mechanism 1127 which conveys the cover unit 1126 between the furnace inlet shielding location and the retreat location by rotating (pivoting) the arm unit 222, using the shaft unit 223 as the rotation axis, but the cover unit opening/closing mechanism 1127 is not limited thereto. For example, the cover unit opening/closing mechanism 1127 may be a mechanism that linearly slides and conveys the cover unit 1126 between the furnace inlet shielding location and the retreat location.

When the cover unit 1126 is linearly slid, the cover unit opening/closing mechanism may have, for example, an arm mechanism that is extendible/shrinkable in one direction (a linear direction). In addition, one end of the arm mechanism may support the cover unit 1126 and the other end of the arm mechanism may be fixed to, for example, the base plate 1114. The cover unit opening/closing mechanism may linearly convey the cover unit 1126 between the furnace inlet shielding location and the retreat location by expanding/shrinking the arm mechanism. Further, the cover unit opening/closing mechanism may include a vertical movement mechanism section that moves the arm mechanism in the Z-axis direction. When the vertical movement mechanism section is provided, the arm mechanism may be configured to be fixed to the base plate 1114 through the vertical movement mechanism section rather than being directly fixed to the base plate 1114. When the vertical movement mechanism section is provided, the cover unit 1126 may be conveyed to the furnace inlet shielding location (half close furnace inlet shielding location) and then conveyed in the Z-axis direction to the location to be come into contact with the manifold 21 forming the furnace inlet 1111a. When the cover unit 1126 is conveyed to the full close furnace inlet shielding location, the furnace inlet 1111a may be hermetically closed.

Next, the auxiliary mechanism 1128 will be described.

As described above, the furnace inlet 1111a may be blocked by causing the cover unit 1126 to be in contact with the manifold 21 forming the furnace inlet 1111a by the cover unit opening/closing mechanism 1127. However, since the cover unit opening/closing mechanism 1127 supports the cover unit 1126 in a cantilever manner from the bottom side, it is difficult to horizontally maintain the cover unit 1126 only by the cover unit opening/closing mechanism 1127. Thus, when the cover unit 1126 is supported to be in close contact with the furnace inlet 1111a only with the cover unit opening/closing mechanism 1127, a gap may occur between cover unit 1126 and the manifold 21 and as a result, the furnace inlet 1111a may not be sealed.

In particular, in recent years, the diameters of wafers as processing target objects increase to 300 mm and 450 mm and the size of the furnace inlet 1111a or the cover unit 1126 also increases according to the increased diameter. Further, as the size of the cover unit 1126 increases, the weight of the cover unit 1126 also increases. Therefore, it is particularly difficult to horizontally support the cover unit 1126 only by the cover unit opening/closing mechanism 1127 and gap may more easily occur between the cover unit 1126 and the manifold 21.

Therefore, the auxiliary mechanism 1128 may be provided in the vertical heat treatment apparatus 10 of the exemplary embodiment. Since the auxiliary mechanism 1128 may support and press the cover unit 1126 together with the cover unit opening/closing mechanism 1127, it is possible to more horizontally maintain the cover unit 1126 as compared with the case in which the cover unit 1126 is supported in a cantilever manner only by the cover unit opening/closing mechanism 1127. In addition, since the cover unit 1126 may be urged to be strongly in contact with the manifold 21, it may be possible to prevent occurrence of the gap between the cover unit 1126 and the manifold 21. Therefore, the sealability of the heat treatment furnace 1111 may be improved when the furnace inlet 1111a of the heat treatment furnace 1111 is blocked by the cover unit 1126.

Further, when the cover unit 1126 is only supported in a cantilever manner as described above, the gap may occur more easily between the cover unit 1126 and the manifold 21 as the size of the wafer increases. Whereas, in the vertical heat treatment apparatus 10 of the exemplary embodiment, occurrence of the gap between the cover unit 1126 and the manifold 21 may be prevented regardless of the size of the wafers and the vertical heat treatment apparatus 10 of the exemplary embodiment exhibits a particularly excellent effect as the diameter of the wafers increases. As a result, the wafers processed by the vertical heat treatment apparatus 10 of the exemplary embodiment may be, for example, wafers having a diameter of 300 mm or more. In particular, the wafers may be wafers having a diameter of 450 mm or more.

The configuration of the auxiliary mechanism 1128 is not particularly limited as long as the auxiliary mechanism 1128 may press the cover unit 1126 from the bottom side thereof, but the auxiliary mechanism 1128 may include a toggle mechanism.

The auxiliary mechanism 1128 may include an extendible mechanism section 241, a link plate 242, a link plate-auxiliary mechanism arm unit connection plate 243, and an auxiliary mechanism arm unit 244 as illustrated in FIGS. 2A and 2B.

The link plate 242 forms a triangle, in which the extendible mechanism section 241 may be connected to the link plate 242 in the vicinity of one apex among three apexes and the link plate-auxiliary mechanism arm unit connection plate 243 may be connected to the link plate 242 in the vicinity of one apex. Further, at the connection point of the link plate 242 and the extendible mechanism section 241 and the connection point of the link plate 242 and the link plate-auxiliary mechanism arm unit connection plate 243, the link plate 242 may be rotatably connected. Another apex of the link plate 242 fixed to a predetermined spot such that the link plate 242 is rotatable.

The link plate-auxiliary mechanism arm unit connection plate 243 may also be connected to the auxiliary mechanism arm unit 244 and the link plate-auxiliary mechanism arm unit connection plate 243 may be connected to an optional spot rather than the end of the auxiliary mechanism arm unit 244. When the link plate-auxiliary mechanism arm unit connection plate 243 is connected with the auxiliary mechanism arm unit 244, the link plate-auxiliary mechanism arm unit connection plate 243 may be rotatably connected at the connection point.

One end of the auxiliary mechanism arm unit 244 may be fixed to an optional spot such that the auxiliary mechanism arm unit 244 may be rotatable. Further, for example, a press member configured to press the support member 232 may be provided at the other end of the auxiliary mechanism arm unit 244.

The extendible mechanism section 241 includes an extendible rod portion and a front end of the rod portion may be connected to the vicinity of one apex of the link plate 242 as described above. Although the configuration of the extendible mechanism section 241 is not particularly limited as long as it includes the extendible rod portion, the extendible mechanism section 241 may be configured by, for example, an air cylinder.

Herein, the toggle mechanism of the auxiliary mechanism 1128 will be described with reference to FIGS. 4A and 4B. FIGS. 4A and 4B schematically illustrate the auxiliary mechanism 1128 dots and lines so as to easily understand a point serving as the rotation center of each member. FIG. 4A corresponds to a state in which the auxiliary mechanism 1128 does not press the cover unit 1126 similarly to FIG. 2A, that is, a state in which the auxiliary mechanism 1126 does not clamp the cover unit 1126. In addition, FIG. 4B corresponds to a state in which the auxiliary mechanism 1128 presses the cover unit 1126 similarly to FIG. 2B, that is, a state which the auxiliary mechanism 1126 clamps the cover unit 1126.

In FIGS. 4A and 4B, triangle ABC corresponds to the link plate 242 in FIGS. 2A and 2B, line segment BE corresponds to the link plate-auxiliary mechanism arm unit connection plate 243 in FIGS. 2A and 2B, and line segment DF corresponds to the auxiliary mechanism arm unit 244 in FIGS. 2A and 2B. Point F may press, for example, the support member 232.

First, as illustrated in FIG. 4A, the extendible mechanism section 241 extends the load portion 241*a* in the direction of arrow 41, and as a result, the link plate 242 (triangle ABC) rotates in the direction of arrow 42 around apex C, that is, counterclockwise (leftward). In this case, the auxiliary mechanism arm unit 244 (line segment DF) rotates in the direction of arrow 43 around point D, that is, counterclockwise (leftward). In addition, the extendible mechanism section 241 further extends the load portion 241*a* in the direction of arrow 41 to be in the state of FIG. 4B.

FIG. 4B illustrates a case in which point E which is one end of the link plate-auxiliary mechanism arm unit connection plate 243 (line segment BE) is positioned on line segment BC representing one side of the link plate 242 (triangle ABC). However, hereinafter, the operation of the toggle will be described divisionally with reference to a case in which point E is positioned at the right side of line segment BC and a case in which point E is positioned at the left side of line segment BC.

From the state in which point E is positioned at the right side of line segment BC, when the load portion 241*a* of the extendible mechanism section 241 is further expanded in the direction of arrow 41, point E moves to the left side and point E moves to the left side of line segment BC. In addition, when point E is positioned at the right side of line segment BC, the toggle does not act and when point E is positioned at the left side of line segment BC, the toggle acts.

First, descriptions will be made on the state in which point E is positioned at the right side of line segment BC in FIG. 4B, that is, the state in which the toggle does not act.

In FIG. 4B, after point E is positioned at the right side of line segment BC, a pressure applied in the direction of arrow 41 by the extendible mechanism section 241 is removed and the extendible mechanism section 241 does not apply a force to the link plate 242 (triangle ABC). In addition, in this state, when a downward force is applied to point F as indicated by arrow 44, the link plate-auxiliary mechanism arm unit connection plate 243 (line segment BE) rotates in the direction of arrow 45 (rightward) using point B as a pivot point, and the link plate 242 (triangle ABC) rotates in the direction of arrow 46 (leftward) using point C as the pivot point. As a result, the point F side end of the auxiliary mechanism arm unit 244 (line segment DF) moves down in the direction of an applied load, that is, in the direction of block arrow 44.

Next, descriptions will be made on the state in which point E is positioned at the left side of line segment BC in FIG. 4B, that is, the state in which the toggle acts.

In FIG. 4B, after point E is positioned at the left side of line segment BC, a pressure applied in the direction of arrow 41 by the extendible mechanism section 241 is removed and the extendible mechanism section 241 does not apply a force to the link plate 242. In addition, in this state, a downward force is applied to point F as indicated by block arrow 44 similarly as described above. In this case, the link plate-auxiliary mechanism arm unit connection plate 243 (line segment BE) tends to rotate in the direction (leftward) of arrow 47 using point V as the pivot point. In addition, the link plate 242 (triangle ABC) tends to rotate in the direction (rightward) of arrow 48 around point C. When the link plate 242 (triangle ABC) tends to rotate in the direction of arrow 48, the link plate-auxiliary mechanism arm unit connection plate 243 (line segment BE) is pushed upward. Then, the auxiliary mechanism arm unit 244 (line segment DF) tends to rotate around point D in the direction opposite to the direction of the weight indicated by block arrow 44, that is, in the direction of arrow 49. As a result, in the state where the toggle acts, even if the force from the extendible mechanism section 241 is not applied, the auxiliary mechanism arm unit 244 (line segment DF) may be resistant to the load to maintain the location thereof.

As described hereinabove, when the auxiliary mechanism 1128 includes the toggle mechanism, by placing the toggle in the acting state, the auxiliary mechanism 1128 may continuously support the cover unit 1126, even if the output from the extendible mechanism section 241 is removed. Therefore, abrupt occurrence of a gap between the cover unit 1126 and the manifold 21 may be prevented and the sealability in the heat treatment furnace 1111 closed by the cover unit 1126 may be maintained more reliably.

As illustrated in FIG. 2B, in the case where the cover unit 1126 is pressed from the bottom side of the cover unit 1126 by the auxiliary mechanism 1128, when the auxiliary mechanism 1128 includes the toggle mechanism, it is preferable that the extendible mechanism section 241 is actuated until the toggle is in the acting state due to the reason described above.

Next, a position where the auxiliary mechanism 1128 presses the cover unit 1126 will be described.

As described above, the cover unit 1126 may include the support member 232. In addition, when the cover unit 1126 includes the support member 232, the auxiliary mechanism 1128 may press the cover unit 1126 from the bottom side of the support member 232. Further, although the auxiliary mechanism 1128 may also directly press the support member 232 from the bottom side of the support member 232, the auxiliary mechanism 1128 may press the arm unit 222 so as to press the support member 232 through the arm unit 222.

Descriptions will be made on a position preferably pressed by the auxiliary mechanism 1128 in the case where the cover unit 1126 includes the support member 232, with reference to FIG. 5.

Figure 5:
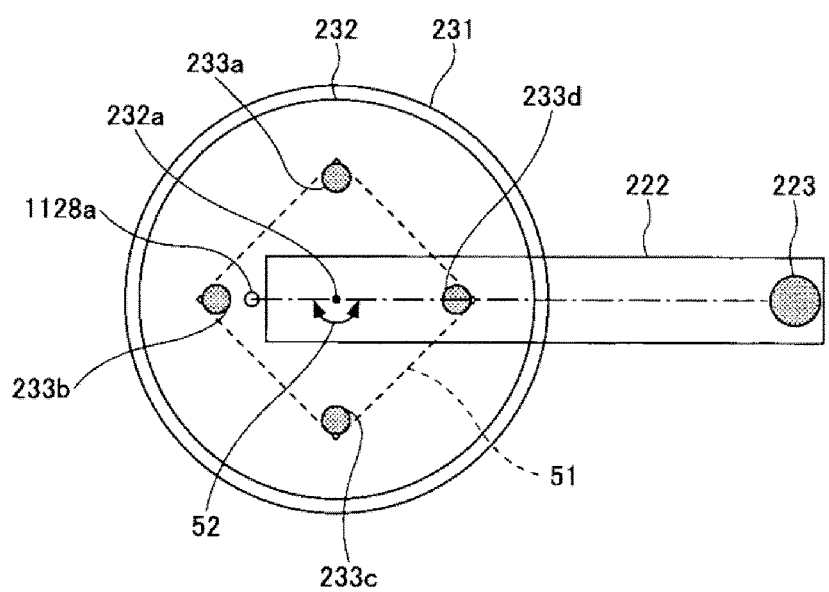
FIG. 5 is an explanatory view illustrating a place pressed by the auxiliary mechanism in the vertical processing apparatus according to the exemplary embodiment of the present disclosure.

FIG. 5 illustrates a view illustrating the arm unit 222 and the support member 232 viewed from the bottom side when the cover unit 1126 is disposed at a furnace inlet shielding position. In FIG. 5, members other than those required for description are omitted. Further, since elastic bodies 233 (233*a* to 233*d*) are disposed between the support member 232 and the furnace inlet shielding part 231, the elastic bodies 233 are not seen from the bottom side of the support member 232, but illustrated for convenience of description. Further, although an example in which four elastic bodies 233*a* to 233*d* are disposed as the elastic bodies 233 is illustrated, the number of elastic bodies 233 is not limited as described above. For example, more than four or less than four elastic bodies may be disposed.

A position of an auxiliary mechanism pressing point 1128*a* which is a point pressed from the bottom side of the support member 232 by the auxiliary mechanism 1128 may be optionally selected depending on, for example, a size and a weight of the cover unit 1126 and a pressing force for the support member 232 by the arm unit 222, rather than being particularly limited.

However, it is preferable that when the cover unit 1126 is pressed by the auxiliary mechanism 1128 from the bottom side of the support member 232, the pressing force is substantially uniformly applied to the entire cover unit 1126. For this reason, when the auxiliary mechanism 1128 presses the support member 232 from the bottom side of the support member 232, the auxiliary mechanism 1128 may press the inside of a region surrounded by contact points of the support member 232 and the plurality of elastic bodies 233 (233a to 233d). Specifically, for example, in the case of disposing the elastic bodies 233a to 233d as in FIG. 5, the auxiliary mechanism 1128 may press the inside of a region 51 surrounded by the contact points of the support member 232 and the elastic bodies 233a to 233d.

Further, the contact points of the support member 232 and the elastic bodies 233 have a substantially circular shape when the elastic bodies 233 are metallic springs. When the contact points of the support member 232 and the plurality of elastic bodies 233 have the substantially circular shape, the region 51 a region surrounded by common contact lines of adjacent contact points of the support member 232 and the plurality of elastic bodies 233 in which the common contact lines are positioned outside the lines connecting the centers of the contact points of the support member 232 and the plurality of elastic bodies 233. For this reason, as illustrated in FIG. 5, the regions just below the contact points of the support member 232 and the plurality of elastic bodies 233 are included in the region 51.

The auxiliary mechanism 1128 presses the inside of the region 51 surrounded by the contact points of the support member 232 and the plurality of elastic bodies 233 (233a to 233d), and thus the force locally applied to the support member 232 by the auxiliary mechanism 1128 may be distributed by the elastic bodies 233. Accordingly, the force may be substantially uniformly applied in plane with respect to the surface of the furnace inlet shielding portion 231 which faces the support member 232.

Further, in order to particularly suppress occurrence of a gap between the cover unit 1126 and the manifold 21, an angle 52 formed by three points of the auxiliary mechanism pressing point 1128a, the center 232a of the support member 232, and a support point of the arm unit 222 may be in a range of 90° to 270°. Further, the support point of the arm unit 222 refers to the center of the shaft portion 223, for example, when the arm unit 222 of the cover unit opening and closing mechanism 1127 is supported by the shaft portion 223 as described above.

With respect to the portion of the cover unit 1126 supported by the arm unit 222 from the bottom side of the cover unit 1126 and a portion having a short distance from the portion supported by the arm unit 222, a gap is hardly occur between the cover unit 1126, particularly, the furnace inlet shielding portion 231 and the manifold 21. However, since the arm unit 22 supports the cover unit 1126 in a cantilever manner, the pressing force from the arm unit 222 may not be sufficiently transferred when the distance from the arm unit 222 of the cover unit 1126 is increased even though the elastic body 233 is disposed between the support member 232 and the furnace inlet shielding portion 231. For this reason, a gap may easily occur between the cover unit 1126 and the manifold 21. Accordingly, in order to press a portion where a gap easily occurs between the cover unit 1126 and the manifold 21 by the auxiliary mechanism 1128, the position of the auxiliary mechanism pressing point 1128a may be selected so that the aforementioned angle 52 is in the range of 90° to 270°.

In particular, it is more preferable that the position of the auxiliary mechanism pressing point 1128a where the auxiliary mechanism 1128 presses the support member 232 is within the region surrounded by the contact points of the support member 232 and the plurality of elastic bodies 233, and the angle 52 formed by three points of the auxiliary mechanism pressing point 1128a, the center 232a of the support member 232, and the support point of the arm unit 222 is in the range of 90° to 270°. That is, in the case of the configuration illustrated in FIG. 5, the auxiliary mechanism 1128 may press the inside of the region surrounded by the contact points of the support member 232 and the elastic bodies 233a to 233c.

In the forgoing, description has been made on an example where one auxiliary mechanism 1128 is provided. Without being limited to one, however, a plurality of auxiliary mechanism 1128 may be provided. Even in the case where the plurality of auxiliary mechanism 1128 is provided, the positions of the auxiliary mechanism pressing points 1128a pressed by the plurality of auxiliary mechanism 1128 from the bottom side of the support member 232 are not particularly limited.

However, it is preferable that any one of the plurality of auxiliary mechanism 1128 presses the inside of the region surrounded by the contact points of the support member 232 and the elastic bodies 233. In particular, it is more preferable that all the auxiliary mechanisms 1128 press the inside of the region surrounded by the contact points of the support member 232 and the elastic bodies 233a.

Alternatively, it is preferable that the angle 52 which is formed by three points of the auxiliary mechanism pressing point 1128a of any one of the plurality of auxiliary mechanism 1128, the center 232a of the support member 232, and the support point of the arm unit 222 is in a range of 90° to 270°. In particular, with respect to all the auxiliary mechanisms 1128, it is more preferable that the angle 52 which is formed by three points of the auxiliary mechanism pressing point 1128a, the center 232a of the support member 232, and the support point of the arm unit 222 is in the range of 90° to 270°.

In particular, it is preferable that the position of the auxiliary mechanism pressing point 1128a where any one of the plurality of auxiliary mechanism 1128 presses the support member 232 is within the region surrounded by the contact points of the support member 232 and the plurality of elastic bodies 233, and the angle 52 which is formed by three points of the auxiliary mechanism pressing point 1128a, the center 232a of the support member 232, and the support point of the arm unit 222 is in the range of 90° to 270°. Further, it is more preferable that the position of the auxiliary mechanism pressing point 1128a where all the auxiliary mechanisms 1128 press the support member 232 is in the region surrounded by the contact points of the support member 232 and the plurality of elastic bodies 233, and the angle 52 which is formed by three points of the auxiliary mechanism pressing point 1128a, the center 232a of the support member 232, and the support point of the arm unit 222 is in the range of 90° to 270°.

As described above, in the vertical heat treatment apparatus 10 of the present exemplary embodiment, the furnace inlet 1111a may be hermetically closed by bringing the cover unit 1126 into close contact with the manifold 21 (full-close). In addition, without bringing the cover unit 1126 into contact with the manifold 21, the cover unit 1126 may also be disposed to be spaced apart from the furnace inlet 1111a so as to cover the furnace inlet 1111a (half-close). Since the auxiliary mechanism 1128 is mainly provided for the purpose of suppressing occurrence of a gap between the cover unit 1126 and the manifold 21 when the furnace inlet 1111a of the heat treatment furnace 1111 is closed by the cover unit 1126, the auxiliary mechanism 1128 is especially in the case of the full-close. However, even in the case of the half-close, the cover unit 1126 may be configured to be supported by the auxiliary mechanism 1128 in order to more horizontally keep the cover unit 1126.

Here, although descriptions have been made on the case where the furnace inlet 1111a is closed by the cover unit 1126, the auxiliary mechanism 1128 may also press the cover 1123 closing the furnace inlet 1111a from the bottom side when the holder 1121 is introduced into the heat treatment furnace 1111.

As described above, the vertical heat treatment apparatus 10 of the present exemplary embodiment includes the auxiliary mechanism 1128 in addition to the cover unit opening and closing mechanism 1127, and as a result, when the furnace inlet 1111a of the heat treatment furnace 1111 is closed by the cover unit 1126, occurrence of a gap between the cover unit 1126 and the manifold 21 may be suppressed. In addition, the sealability of the heat treatment furnace 1111 may be increased.

The vertical heat treatment apparatus 10 of the present exemplary embodiment may include, for example, a carrying and storing unit 12 and a carry-in/out unit 13, in addition to the heat treatment unit 11. Hereinafter, exemplary configurations of the carrying and storing unit 12 and the carry-in/out unit 13 will be described with reference to FIG. 1.

(Carrying and Storing Unit)

The carrying and storing unit 12 may include a first storing section (first carrier stage) 121 configured to store a plurality of carrying containers 15. Further, if necessary, a second storing section (second carrier stage) 122 configured to store a plurality of carrying containers 15 may also be provided.

The carrying and storing unit 12 may include a placing table 123a of a transfer section 123 on which a carrying container 15 is placed when the wafers in the carrying container 15 are transferred to the holder 1121 of the heat treatment unit 11. Further, the carrying and storing unit 12 may include a conveying mechanism 124 configured to convey the carrying containers 15 among the first storing section 121, the second storing section 122, the placing table 123a of the transfer section 123, and, for example, the carry-in/out unit 13 to be described below.

The first storing section 121 and the second storing section 122 are configured to place and store the carrying containers 15 thereon. By providing the storing sections on which the carrying containers 15 are placed in the vertical heat treatment apparatus 10, the wafers in the heat treatment furnace 1111 may be rapidly exchanged whenever the processing for the wafers in the heat treatment furnace 1111 is finished, and the throughput of the vertical heat treatment apparatus 10 may be increased.

The first storing section 121 includes multiple tiers of placing shelves 121a to 121d as illustrated in FIG. 1, and on each placing shelf, for example, two carrying containers 15 may be disposed in a direction perpendicular to the sheet of the drawing. The number of tiers of the placing shelves is not particularly limited, and an optional number of tiers may be provided depending on, for example, the height of the vertical heat treatment apparatus 10. The first storing section 121 may be provided on one selected wall of the carrying and storing unit 12, and for example, may be disposed on a wall facing the heat treatment unit 11 of the carrying and storing unit 12.

The second storing section 122 may be provided, for example, at the lower side of the conveying mechanism 124, as illustrated in FIG. 1. The lower side in the present exemplary embodiment refers to a downward direction when in the height direction (the Z-axis direction in FIG. 1) and is irrespective of the location in the horizontal direction (the X-axis direction in FIG. 1 or the direction perpendicular to the sheet). However, the second storing section 122 may be disposed such that at least a part of the second storing section 122 overlaps with the conveying mechanism 124, when the lower side in the height direction (Z-axial direction of FIG. 1), that is, the second storing section 122 side is viewed from the conveying mechanism 124 side. In particular, the second storing section 122 may be disposed just below the conveying mechanism 124.

In the second storing section 122, when the carrying container 15 is disposed in the second storing section 122, the height of the upper end of the carrying container 15 may be the same as the height of the placing table 123a of the transfer section 123 or lower than the height of the placing table 123a of the transfer section 123. However, the height of the placing table of the second storing section 122 may be determined in consideration of an operation area of the conveying mechanism 124 such that the carrying container 15 may be held by the conveying mechanism 124.

With respect to the second storing section 122, for example, two carrying containers 15 may also be disposed side by side in the direction perpendicular to the sheet of FIG. 1, as in the first storing section 121.

The transfer section 123 is called a FIMS port and includes the placing table 123a on which a carrying container 15 is placed. On the placing table 123a of the transfer section 123, the carrying container 15 is placed when the wafers in the carrying container 15 are transferred to the holder 1121 that supplies a plurality of wafers to the heat treatment furnace 1111 or when the wafers are transferred into the carrying container 15 from the holder 1121.

It is preferable that the placing table 123a of the transfer section 123 may be disposed at the lower side of the first storing section 121 as illustrated in FIG. 1. It is more preferable that the placing table 123a of the transfer section 123 is disposed such that at least a part of the transfer section 123 overlaps with the first storing section 121, when the lower side in the Z-axial direction (height direction) of FIG. 1, that is, the transfer section 123 side is viewed from the first storing section 121 side. In particular, it is more preferable that the placing table 123a of the transfer section 123 is disposed just below the first storing section 121.

In addition, the transfer section 123 may include an opening configured to communicate the inside of the loading area 112 in the heat treatment unit 11 and the inside of the carrying container 15 with each other, and an openable/closable door mechanism 123b configured to seal the opening from the loading area 112 side. Further, the transfer section 123 may include a cover opening and closing mechanism (not illustrated) that opens and closes the cover of the carrying container 15.

Further, when the carrying container 15 is placed on the placing table 123a, a protrusion for positioning that performs alignment of the carrying container 15 may be formed on the placing table 123a. Further, a lock unit may also be disposed on the placing table 123a such that the carrying container 15 in a state where a front peripheral edge of the container body is in contact with a partition wall facing the heat treatment unit 11 of the carrying and storing unit 12 when the carrying container 15 is disposed on the placing table 123a.

It is also preferable that the placing table 123a of the transfer section 123 is configured such that two carrying containers 15 may be placed thereon in the direction perpendicular to the sheet of the drawing. In this case, in order to simultaneously transfer wafers to two carrying containers 15, two openings, two door mechanisms 123b, two cover opening and closing mechanisms described above are also disposed in the direction perpendicular to the sheet of the drawing to correspond to the placing locations of the carrying containers 15.

Although FIG. 1 illustrates an example in which the placing table 123a of the transfer section 123 is disposed at the lower side of the first storing section 121, the installation location of the placing table 123a of the transfer section 123 is not limited thereto. For example, the placing shelf 121d among the placing shelves 121a to 121d of the first storing section 121 may be used as the placing shelf of the transfer section 123, and the shelf illustrated as the placing table 123a of the transfer section 123 in FIG. 1 may be used as one of the placing shelves of the first storing section 121. That is, the locations of the placing shelf 121d of the first storing section 121 and the placing table 123a of the transfer section 123 may be switched.

Further, the number of carrying containers 15 which may be disposed on the transfer section 123 is not limited to two and may be optionally changed. For example, when it is necessary to dispose two or more carrying containers 15 on the transfer section 123, the lowermost placing shelf 121d of the first storing section 121 may also be used as the placing table 123a of the transfer section 123. In this case, for example, the openings, the door mechanisms 123b, and the cover opening and closing mechanisms described above may be provided to correspond to the carrying containers 15 disposed at the placing shelf 121d.

Further, the transfer section 123 may be used as a third storing section that temporarily stores the carrying containers 15, according to a situation where wafers are transferred between the holder 1121 and the carrying container 15.

The conveying mechanism 124 may be used as a mechanism that conveys carrying containers 15.

The conveying mechanism 124 may convey the carrying containers 15 between the carrying and storing unit 12 and the outside of the carrying and storing unit 12. Specifically, for example, the conveying mechanism 124 may convey the carrying containers 15 carried in from the carry-in/out unit 13 (described later) to the first storing section 121, the second storing section 122, and the placing table 123a of the transfer section 123. Further, the conveying mechanism 124 may carry the carrying container 15 accommodating the wafers, on which the processings have been completed in the heat treatment unit 11, to the carry-in/out unit 13.

Further, the conveying mechanism 124 may convey the carrying containers 15 within the carrying and storing unit 12. Specifically, the conveying mechanism 124 may convey the carrying containers 15 among the first storing section 121, the second storing section 122, and the placing table 123a of the transfer section 123.

The conveying mechanism 124 is not particularly limited in its detailed configuration as long as it may convey a carrying container 15. For example, the conveying mechanism 124 may employ a mechanism configured to hold and convey the carrying container 15 from the upper side thereof or a mechanism configured to support and convey the carrying container 15 from the bottom side thereof. As the mechanism of holding and conveying the carrying container 15 from the upper side of the carrying container 15, for example, an automation flange may be used.

(Carry-In/Out Unit)

The carry-in/out unit 13 may be disposed adjacent to the carrying and storing unit 12, and may be used as a unit that carries a carrying container 15 accommodating a plurality of wafers into and out of the vertical heat treatment apparatus 10.

The configuration of the carry-in/out unit 13 is not particularly limited, but two tiers of load ports including a lower load port 131 and an upper load port 132 may be disposed, for example, as illustrated in FIG. 1. Each load port may include a table for placing a carrying container 15 thereon and an opening for conducting carry-in/out of the carrying container 15 with respect to the carrying and storing unit 12.

In particular, the lower load port 131 may include a first carry-in/out table 131a configured to place the carrying container 15 thereon and a first opening 131b.

The upper load port 132 may include a second carry-in/out table 132a configured to place the carrying container 15 thereon and a second opening 132b. Further, both the first carry-in/out table 131a and the second carry-in/out table 132a may be configured to dispose, for example, two carrying containers 15 in the direction perpendicular to the sheet of the drawing.

The carrying containers 15 carried into the first carry-in/out table 131a and the second carry-in/out table 132a may be conveyed to, for example, the first storing section 121 or the second storing section 122 in the carrying and storing unit 12, and the placing table 123a of the transfer section 123 by the conveying mechanism 124 of the carrying and storing unit 12. Further, the carrying containers 15 accommodating the wafers, on which the processing has been completed in the heat treatment unit 11, may be discharged to the first carry-in/out table 131a or the second carry-in/out table 132a.

Further, the first carry-in/out table 131a or the second carry-in/out table 132a may also be used as a storing section (fourth storing section) that temporarily stores the carrying containers 15, according to the carry-in/out situation of the carrying containers 15.

Further, the vertical heat treatment apparatus in the exemplary embodiment may be provided with a control unit 14 configured by a computer may be installed, as illustrated in FIG. 1, for example. The control unit 14 may be provided with, for example, a program, a memory, and a CPU configured by a data processor. In the program, various commands (respective steps) may be combined so as to cause the control unit 14 to send a control signal to each unit of the vertical heat treatment apparatus 10 so as to perform respective processing processes such as the conveying of the carrying containers 15, the transfer of wafers between the carrying containers 15 and the holder 1121, the heat treatment of the heat treatment furnace 1111, and the opening and closing of the cover unit 1126. The program may be stored in a computer storage medium, for example, a storage medium such as, for example, a flexible disc, a compact disc, a hard disc, a magneto-optical disc (MO), and a memory card to be installed in the control unit.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A vertical heat treatment apparatus for processing at least one semiconductor wafer, the heat treatment apparatus comprising:
    a heat treatment furnace provided with a furnace inlet at a lower end thereof allowing the at least one semiconductor wafer to be transported into and out of the furnace inlet;
    a cover unit configured to cover the furnace inlet of the heat treatment furnace;
    a cover unit opening/closing mechanism configured to support the cover unit and to position the cover unit away from the furnace inlet when the at least one semiconductor wafer is being processed within the furnace or is being transported into or out of the furnace, and to position the cover unit to cover the furnace inlet at other times; and
    an auxiliary mechanism comprising a toggle clamp with an extendible mechanism section, link plate, and auxiliary mechanism arm unit, the auxiliary mechanism configured to vertically rotate the auxiliary mechanism arm unit about a pivot point when the extendible mechanism section extends and rotates the link plate, such that the auxiliary mechanism arm unit will then clamp the cover unit against the furnace inlet.

2. The vertical heat treatment apparatus of claim 1, wherein the cover unit includes:
    a furnace inlet shielding unit configured to block the furnace inlet, and
    a support member configured to support the furnace inlet shielding unit through a plurality of elastic bodies.

3. The vertical heat treatment apparatus of claim 2, wherein, when the auxiliary mechanism arm unit clamps the cover unit, the auxiliary mechanism arm unit presses an area inside of a region surrounded by contact points of the support member and the plurality of elastic bodies.

* * * * *